United States Patent
Nautiyal et al.

(10) Patent No.: US 9,711,243 B1
(45) Date of Patent: Jul. 18, 2017

(54) REDUNDANCY SCHEMES FOR MEMORY

(71) Applicant: ARM Limited, Cambridge (GB)

(72) Inventors: Vivek Nautiyal, Milpitas, CA (US); Fakhruddin Ali Bohra, Austin, TX (US); Satinderjit Singh, Fremont, CA (US); Jitendra Dasani, Cupertino, CA (US); Shri Sagar Dwivedi, San Jose, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/188,876

(22) Filed: Jun. 21, 2016

(51) Int. Cl.
*G11C 11/00* (2006.01)
*G11C 29/00* (2006.01)
*G11C 11/412* (2006.01)
*G11C 11/417* (2006.01)

(52) U.S. Cl.
CPC .......... *G11C 29/76* (2013.01); *G11C 11/417* (2013.01); *G11C 11/4125* (2013.01)

(58) Field of Classification Search
CPC .......... G11C 11/401; G11C 2029/1208; G11C 2029/1806; G11C 2207/104; G11C 29/44; G11C 29/781; G11C 29/848; G11C 7/1006; G11C 7/20

USPC .............. 365/200, 201, 149, 158, 171, 173, 365/185.01, 185.09, 185.13, 185.19, 365/185.22, 189.07
See application file for complete search history.

(56) References Cited

U.S. PATENT DOCUMENTS

| | | | |
|---|---|---|---|
| 7,420,859 B2 | 9/2008 | Nautiyal | |
| 2005/0104103 A1* | 5/2005 | Hamamoto | H01L 27/115 257/295 |
| 2005/0141264 A1* | 6/2005 | Mutaguchi | G11C 29/781 365/149 |

* cited by examiner

*Primary Examiner* — Thong Q Le
(74) *Attorney, Agent, or Firm* — Pramudji Law Group PLLC; Ari Pramudji

(57) ABSTRACT

Various implementations described herein are directed to an integrated circuit. The integrated circuit may include a first memory cell array disposed in a first area of the integrated circuit. The first memory cell array includes first memory cells. The integrated circuit may include a second memory cell array disposed in a second area of the integrated circuit that is different than the first area. The second memory cell array includes redundant memory cells that are separate from the first memory cells.

16 Claims, 12 Drawing Sheets

500C

500D

500H

REDUNDANCY SCHEMES FOR MEMORY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, an integrated circuit (IC) having components of a computing system provided on a single chip typically refers to system on a chip (SoC). The SoC is fabricated to include digital, analog, mixed-signal, and/or radio-frequency (RF) capability on a single chip substrate. SoC applications are useful for mobile electronic devices due to their low power consumption and minimal area impact in embedded systems.

In some applications, an SOC may include embedded memory, such as, e.g., static random access memory (SRAM). Due to a denser layout, SRAM may have a higher defect density than other logic circuits, and to improve yield of SRAM, redundant SRAM cells may be provided. Conventionally, at the time of wafer testing, faulty SRAM cells are replaced with redundant cells, and their address location is stored in fuses.

Typically, SRAM cells are arranged in an array pattern, and redundant cells are provided as a column or row in the same array as memory cell instances. For SRAM in an SOC, column redundancy is sufficient; however, if accumulated density of SRAM is large, then row redundancy may be used. For instance, FIG. 1 shows a conventional redundancy scheme 100 for an SRAM array 110 of memory cells arranged in columns (Col 0, Col 1, . . . , Col M) and rows (Row 0, Row 1, . . . , Row N).

Further, the SRAM array 110 includes a Redundant Row of memory cells that are used to replace faulty or defective SRAM memory cells. Conventionally, as shown, the Redundant Row of memory cells is provided as part of the SRAM array 110. Further, the SRAM array 110 includes an internal comparator 112 that is used to determine whether faulty or defective SRAM memory cells have been replaced with redundant memory cells.

Conventionally, when a repaired row is accessed, an incoming row address from an SoC is compared with a faulty row address, and if there is no match, then regular row decoding occurs; otherwise, a redundant row is accessed via a repaired address from a fuse. Unfortunately, this additional comparison for repaired memory as compared to fault free memory typically causes an increase in setup time for addresses of repaired memory. Further, this increased setup time may slow down the overall performance and speed of SOC. As such, this increase in address setup time due to additional comparison operations is a typical problem for conventional row redundancy schemes.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to redundancy schemes for memory applications. For instance, some redundancy schemes may refer to bolt-on row redundancy schemes including, e.g., zero-delay, bolt-on row redundancy schemes for high density memory compilers. In this implementation, this scheme may refer to zero address setup time penalty, which is desirable for SoC designers.

Various implementations of boost circuitry for memory applications will now be described in greater detail herein with reference to FIGS. 2A-6.

Figure 2A:
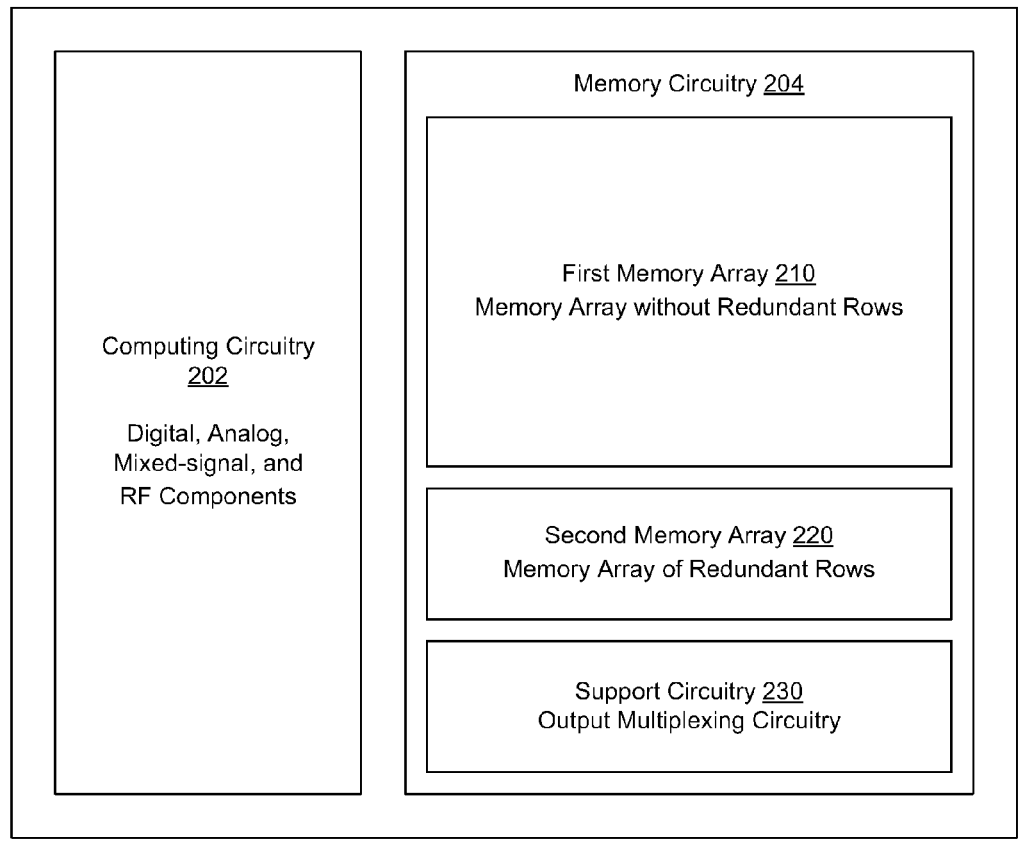
FIGS. 2A-2B illustrate diagrams of a redundant memory scheme utilized by a device in accordance with various implementations described herein.
Figure 2B:
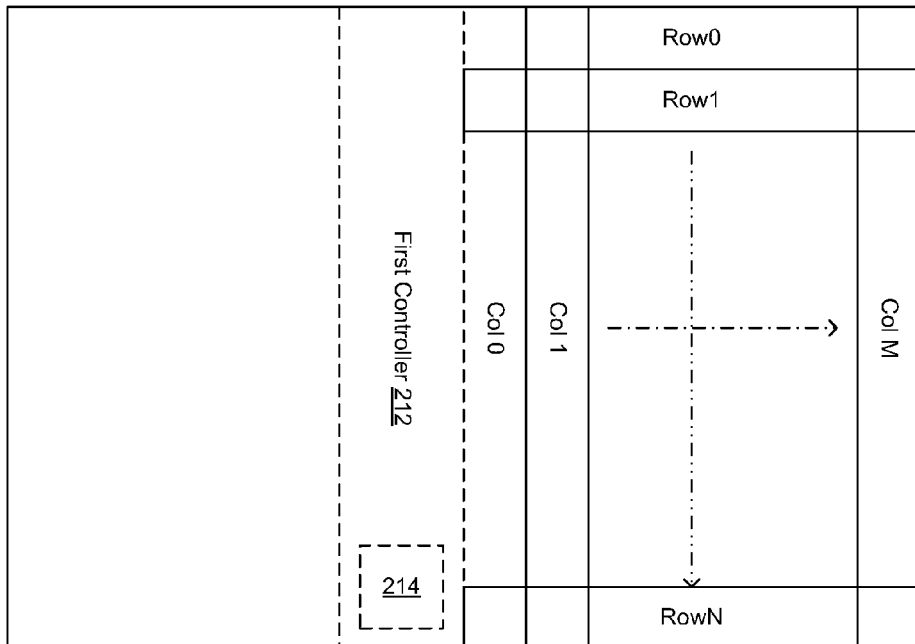
Figure 2B:
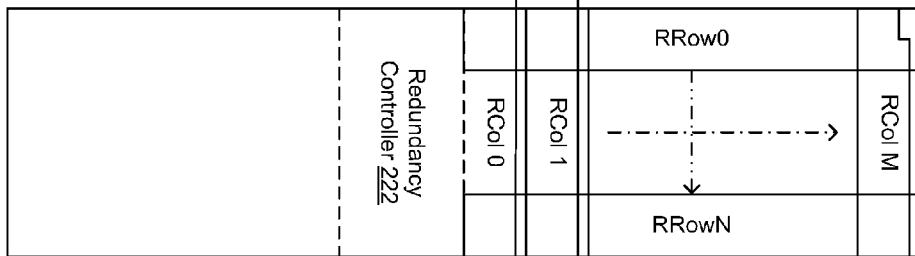
Figure 2B:
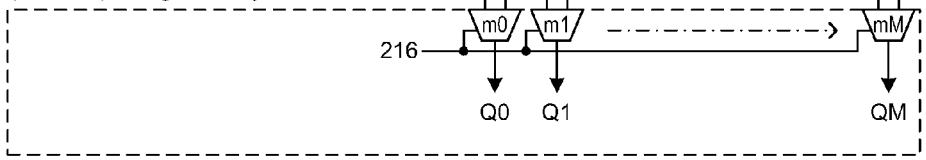

FIGS. 2A-2B illustrate diagrams of a redundant memory scheme utilized by a device 200 in accordance with various implementations described herein. In particular, FIG. 2A illustrates a diagram of the device 200 utilizing the redundant memory scheme, and FIG. 2B illustrates another diagram of multiple memory arrays 210, 220 utilized by the device 200 with the redundant memory scheme.

The device 200 may be implemented as a circuit, such as, e.g., an integrated circuit (IC) having computing circuitry 202 (including digital, analog, mixed-signal, and RF components), memory circuitry 204, (SRAM and/or other types of memory, including any and all types of volatile and non-volatile type memory), and various other computer related components. In some implementations, the device 200 may be designed as an SoC that integrates the computing circuitry 202, the memory circuitry 204, and various other related components on a single chip. The device 200 may be used as an embedded system for various electronic and mobile applications.

In reference to FIG. 2A, the device 200 may include the memory circuitry 204 that utilizes the redundant memory scheme with multiple memory arrays, including a first memory array 210 without redundant rows and a second memory array 220 of redundant rows. The memory circuitry 204 may further include support circuitry 230, such as, e.g., output multiplexing circuitry, which is described in reference to FIG. 2B.

The memory circuitry 204 may be implemented as a circuit, such as, e.g., an integrated circuit (IC), along with the first memory array 210, the second memory array 220, and the support circuitry 230. Each of the first and second memory arrays 210, 220 may include a plurality of memory cells, and as such, the first memory array 210 may be referred to as a first memory cell array, and the second memory array 220 may be referred to as a second memory cell array.

In some implementations, the first memory cell array 210 may be disposed in a first area of the memory circuitry 204. As shown in FIG. 2B, the first memory cell array 210 may include a plurality of first memory cells that are arranged in first columns (Col0, Col1, . . . , ColM) and first rows (Row0, Row1, . . . , RowN). The first memory cells may be referred to as a bitcell, and each memory cell may be configured to store at least one data bit value (e.g., related to logic 0 or 1). In some cases, the first memory cells of the first memory cell array 210 may be implemented with SRAM circuitry. Thus, in some of these cases, each memory cell may include a multi-transistor SRAM cell, including various types of SRAM cells, such as, e.g., 6T CMOS SRAM and/or other types of CMOS SRAM cells, such as, e.g., 4T, 8T, 10T or more transistors per bit. In various implementations, the first memory cells of the first memory cell array 210 may be implemented with volatile circuitry (e.g., SRAM, etc.) and/or non-volatile circuitry, such as, e.g., Dynamic RAM (DRAM), Read-Only Memory (ROM), or other similar non-volatile circuitry. Therefore, the memory circuitry described herein is not limited to volatile type memory applications, such as, e.g., SRAM, etc., but may be utilized in various non-volatile type memory applications, such as, e.g., DRAM, ROM, etc.

In some implementations, the second memory cell array 220 may be disposed in a second area of the integrated circuit that is different than the first area. As shown in FIG. 2B, the second memory cell array 220 may include a plurality of second memory cells that are arranged in second columns (RCol0, RCol1, . . . , RColM) and second rows (RRow0, RRow1, . . . , RRowN). The second memory cells of the second memory cell array 220 are separate from the first memory cells of the first memory cell array 210. The second memory cells may be referred to as redundant memory cells. As shown in FIG. 2B, the second columns (RCol0, RCol1, . . . , RColM) may be aligned with the first columns (Col0, Col1, . . . , ColM), and the second rows (RRow0, RRow1, . . . , RRowN) are separate from and in addition to the first rows (Row0, Row1, . . . , RowN).

In accordance with implementations described herein, the second memory cell array 220 may be referred to as a redundant memory cell array having redundant memory cells, which may be arranged in one or more rows of redundant memory cells (RRow0, RRow1, . . . , RRowN). In some implementations, the second memory cell array 220 may be referred to as a row redundancy memory cell array having one or more rows of second memory cells, which may be referred to as redundant memory cells. Therefore, in various implementations, the second memory cell array 220 may have any number of redundant rows and any number of redundant memory cells.

In some cases, the redundant memory cells may be referred to as a bitcell, and each redundant memory cell may be configured to store at least one data bit value (e.g., related to logic 0 or 1). In various implementations, the redundant memory cells of the second memory cell array 220 may be implemented with flip-flop circuitry, latch circuitry, or some other type of logic or memory storage device circuitry. Thus, in some of these implementations, each redundant memory cell includes some type of logic device (e.g., flip-flop, latch, or similar) that is capable of storing at least one data bit value. In other implementations, each redundant memory cell may include a multi-transistor SRAM cell, including various types of SRAM cells, such as, e.g., 6T CMOS SRAM and/or other types of CMOS SRAM cells, such as, e.g., 4T, 8T, 10T or more transistors per bit. In various implementations, the second or redundant memory cells of the second memory cell array 220 may be implemented with volatile circuitry (e.g., flip-flop, latch, SRAM, etc.) and/or non-volatile circuitry, such as, e.g., DRAM, ROM, or other similar non-volatile circuitry. As such, the memory circuitry described herein is not limited to volatile type memory applications, such as, e.g., flip-flop, latch, SRAM, etc., but may be utilized in various non-volatile type memory applications, such as, e.g., DRAM, ROM, etc.

Due to dense layout, the first memory cell array 210 may have a higher defect density than other logic circuits of the device 200. Therefore, to improve yield of the first memory cell array 210, the second memory cell array 220 of redundant memory cells may be utilized to replace (or re-address) faulty or defective memory cells of the first memory cell array 210. For instance, if one or more of the first memory cells are faulty or defective, then each of the one or more defective first memory cells may be replaced with one of the redundant memory cells of the second memory cell array 220. Hence, in some situations, if one or more of the first memory cells are faulty or defective, then an address of each of the one or more faulty or defective first memory cells is replaced with another address of one of the redundant memory cells of the second memory cell array 220. As such, if one or more of the first memory cells are faulty or defective, then one or more addresses of the faulty or defective first memory cells may be re-addressed to correspond to one or more other addresses of the redundant memory cells.

The first memory cell array 210 may include a first controller 212 (or first control circuitry) that controls access to each of the first memory cells. The first controller 212 may include an address comparator 214 (or address comparator circuitry) that compares addresses of defective memory cells of the first memory cells to other addresses of the redundant memory cells. For instance, if a match is determined to exist, then an address of a defective first memory cell may be reassigned (or re-addressed) to another address of a redundant memory cell as provided by the second memory cell array 220. Further, in some cases, the second memory cell array 220 may include a redundancy controller 222 (or redundancy control circuitry) that controls access to each redundant memory cell based on access requests received from the first controller 212.

Further, the memory circuitry 204 may include the support circuitry 230, which may be implemented with output multiplexing circuitry that receives data signals from the first and redundant memory cell arrays 210, 220 and provides at least one of the received data signals as output based on one or more selection control signals 216 received from the first controller 212 and/or the second controller 222. As shown in FIG. 2B, the output multiplexing circuitry 230 may include a plurality of multiplexers (MUX; m0, m1, . . . , mM), e.g., one for each column. For instance, as shown in FIG. 2B, each multiplexer (MUX; m0, m1, . . . , mM) may be configured to receive one data signal as input from a first column (Col0, Col1, . . . , ColM) and further receive another data signal as another input from a second redundant column (RCol0, RCol1, . . . , RColM). The control signal 216 may be used to select which multiplexed data signal is output as signal Q. As shown, each of the multiplexers (MUX; m0, m1, . . . , mM) may output a Q signal (Q0, Q1, . . . , QM) for each corresponding column associated therewith.

Figure 3:
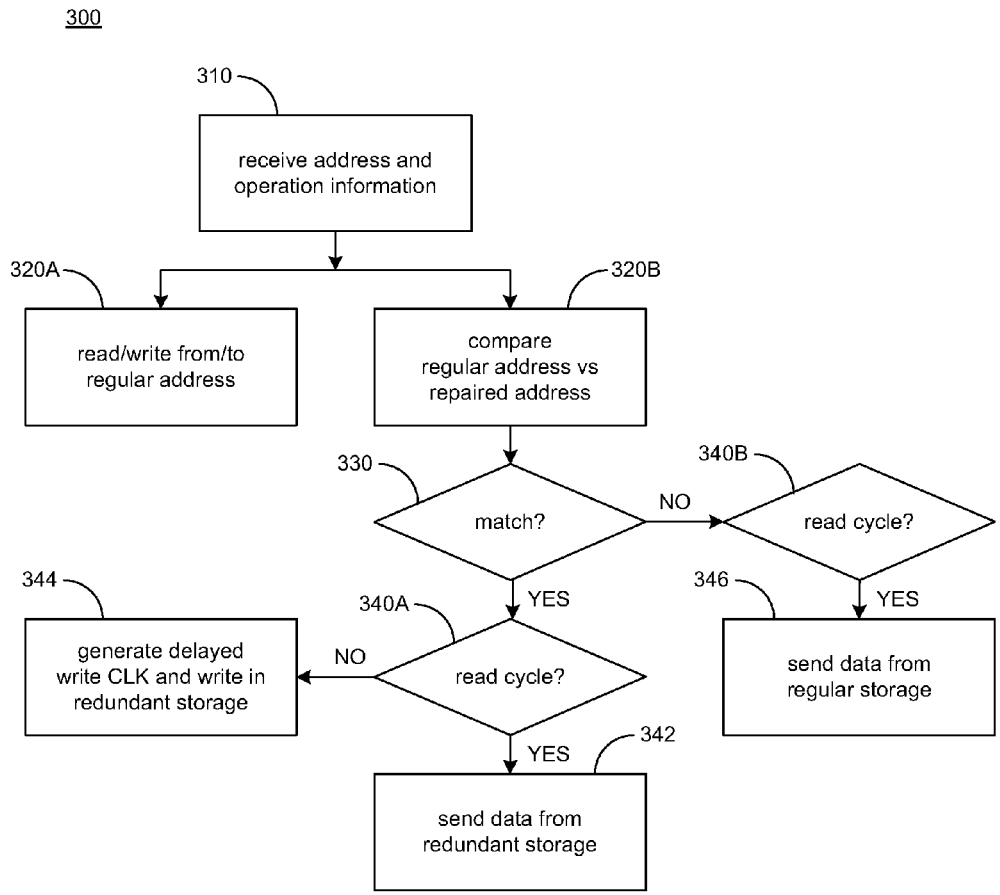
FIG. 3 illustrates a process flow of a method for utilizing row redundancy for memory in accordance with various implementations described herein.

FIG. 3 illustrates a process flow of a method 300 for utilizing row redundancy schemes for memory applications in accordance with various implementations described herein. It should be understood that even though method 300 may indicate a particular order of operation execution, in some instances, various certain portions of the operations may be executed in a different order, and on different systems. In some other instances, additional operations or steps may be added to and/or omitted from method 300. Further, the method 300 may be implemented in hardware and/or software. If implemented in hardware, the method 300 may be implemented with various circuit components, such as described herein above in reference to FIGS. 2A-2B. If implemented in software, the method 300 may be implemented as a program or software instruction process that may be configured to provide row redundancy as described herein. Further, if implemented in software, instructions related to implementing the method 300 may be stored in memory and/or a database. For instance, a computer or various other computing devices having a processor and memory may be configured to perform method 300.

In reference to FIG. 3, method 300 may provide row redundancy schemes for memory applications. In some implementations, instead of having redundant rows in the first memory array, redundant rows are provided in a separate bolt-on redundant memory array. With this approach, two operations may be performed in parallel. For instance, in block 310, method 300 may receive address and operation information. Then, in parallel blocks, 320A, 320B, after receiving address and operation information, method 300 may read/write data from/to a regular address (320A) of the first memory cell array, and/or compare a regular address versus a repaired address (320B) of the redundant memory array. In block 330, method 300 may determine if a match exists between a regular address versus a repaired address. If a match exists, then in block 340A, method 300 determines if the received operation refers to a read cycle. If the operation refers to a read cycle, then in block 342, method 300 sends data from the redundant storage. Otherwise, if the operation does not refer to a read cycle, and instead refers to a write cycle, then in block 344, method 300 generates a delayed write clock (CLK) and writes the data in the redundant storage, such as, e.g., a redundant memory cell in the redundant memory array.

Further, from block 330, if a match does not exist, then in block 340B, method 300 determines if the received operation refers to a read cycle. If the operation refers to a read cycle, then in block 346, method 300 sends data from the regular storage, such as, e.g., from a first cell of the first memory array.

In some implementations, the pseudo-code provided below may be utilized by method 300 to implement row redundancy schemes as described in FIG. 3:

Always read/write from/to addressed memory location
Compare address with faulty (or defective) address
  if (Match && READ)
    Q=Latch Data;
  else if (! Match && READ)
    Q=mem_data;
  else If (Match && Write)
    Write into spare latches;

In some implementations, as described herein, the redundant memory scheme may provide for a bolt-on array of redundant memory cells (e.g., flip-flop devices, latch devices, SRAM devices, etc.) in one or more redundant rows and a corresponding method of reading/writing data to/from the redundant memory cells. Further, as further described herein, the redundant memory scheme may provide for a method of accessing each of these redundant memory cells in such a way that there may be no address setup time penalty for accessing the redundant memory cell instances with the repaired fault through utilization of redundant rows. Further details are described herein below.

Figure 4:
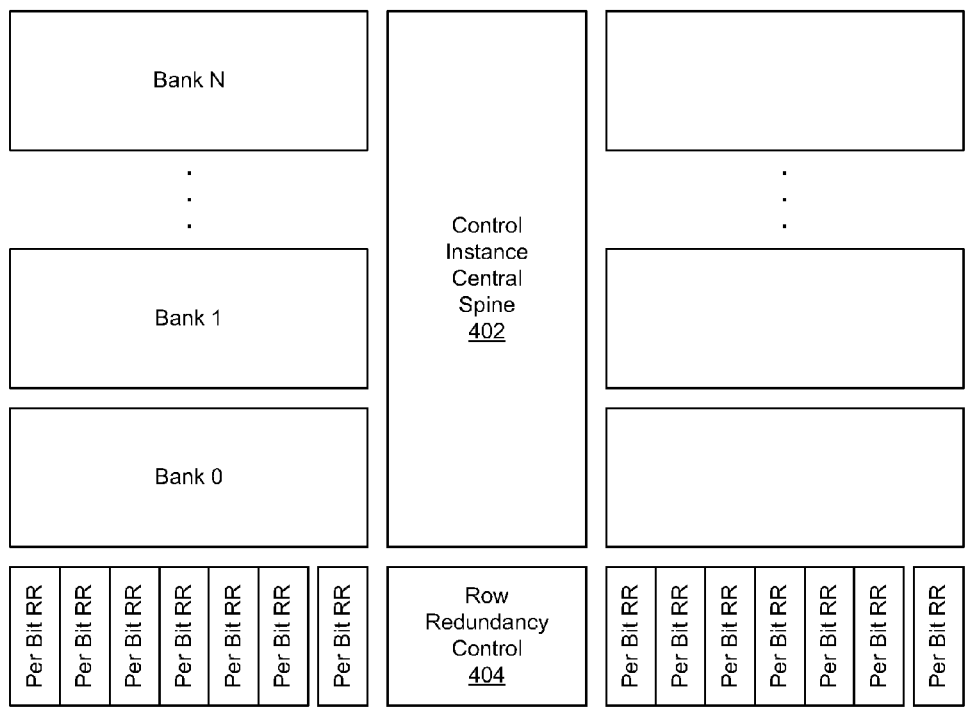
FIG. 4 illustrates another diagram of a redundant memory scheme utilized by a device in accordance with various implementations described herein.

FIG. 4 illustrates another diagram of a redundant memory scheme utilized by the device 200 in accordance with various implementations described herein. In some implementations, the redundant memory scheme of FIG. 4 may be referred to as a multi-bank flip-flop based row redundancy scheme. In some cases, row redundancy schemes may only be supported in conjunction with column redundancy, and it may not be possible to enable row redundancy independently of column redundancy.

As shown in FIG. 4, a memory instance 400 may include one or more banks (Bank 0, Bank 1, . . . , Bank N) controlled by control circuitry related to a control instance central spine 402. Further, the memory instance 400 may include a row of redundant bits (multiple instances of Per Bit RR) controlled by row redundancy control circuitry 404.

For instance, when row redundancy (RR) is enabled, one or more additional rows (made up of logic latches, logic flip-flops, SRAM bitcells, etc.) may be added to the memory instance, such as, e.g., one or more rows of redundant bits (multiple instances of Per Bit RR: Redundancy Row). This addition of a single row (or, in some cases, multiple rows) may be independent of a number of banks (e.g., Bank 0, Bank 1, . . . , Bank N). In some cases, for multibank/single bank options, a single redundant row may be added to the array. In other cases, for multibank/single bank options, multiple redundant rows may be added to the array.

In some implementations, only a single faulty or defective row may be replaced by an additional redundant row. For instance, if row redundancy is enabled (RRE=1), then a value on the Faulty Row Address port (FRA[x:0]) is compared with a regular row address port (RA[x:0]), where x is a total number of address bits (column address bits +1); here, a full row address is compared, which refers to a row address in a bank and bank address. In some cases, if a compared address matches, then data is read/written into the redundant row. There is no shifting or disabling of a faulty (or defective) row in the memory array. Even in a case of a match between a Faulty Row Address (FRA) and a regular row address, data may also be written/read to/from a regular array. However, in some cases, during the read and match case, output may be provided from the redundant memory row to a Q pin of a multiplexer (MUX). It may be expected that row redundancy as an option may only be enabled in conjunction with column redundancy. However, for the purposes of this disclosure, column redundancy is omitted.

FIGS. 5A-5H illustrate various logic circuits that may be utilized to implement row redundancy schemes and techniques for memory applications in accordance with various implementations described herein.

Figure 1:
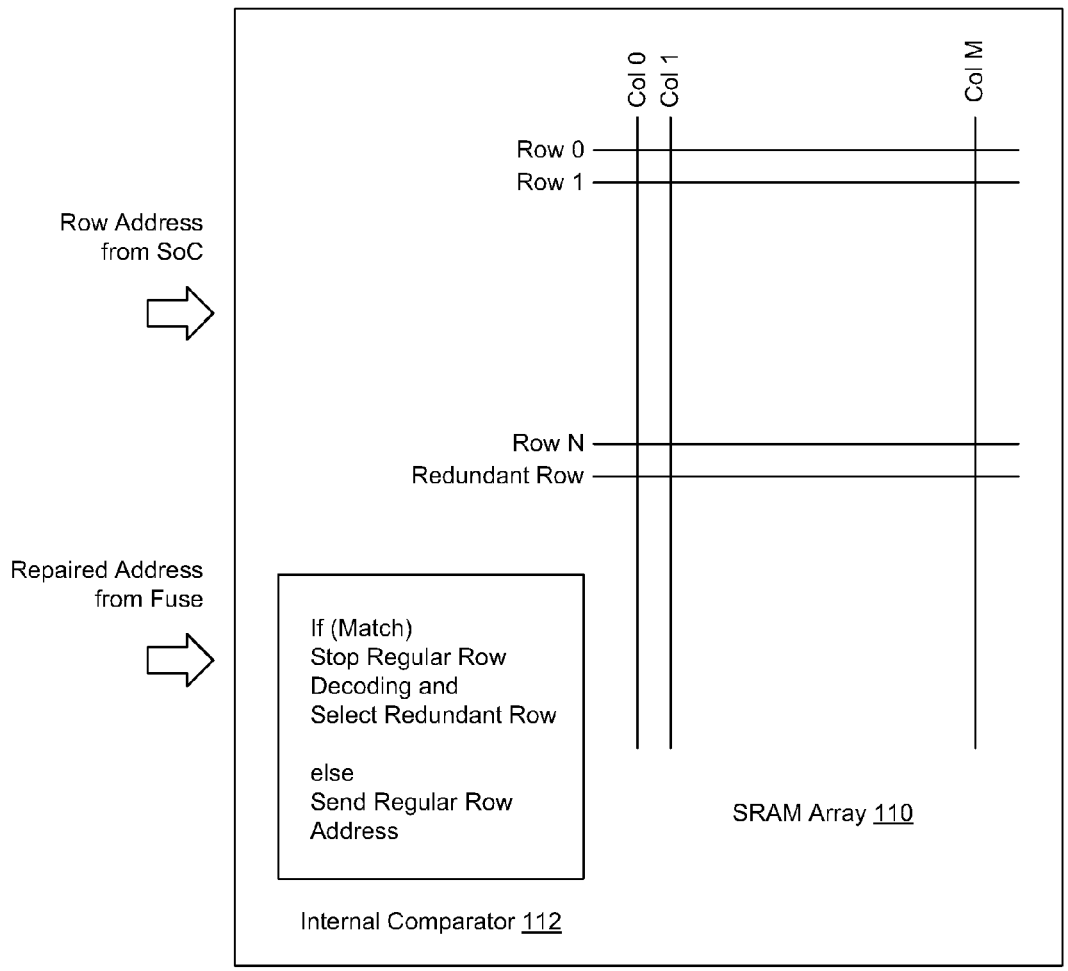
FIG. 1 illustrates conventional memory circuitry as known in the art.
Figure 5A:
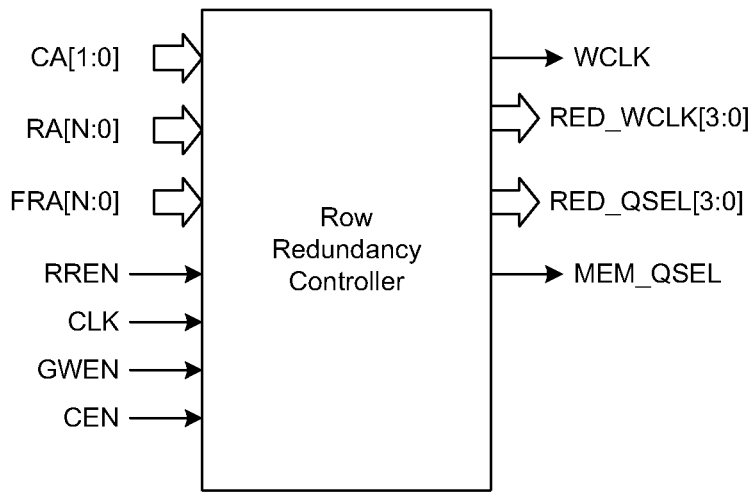
FIGS. 5A-5H illustrate various logic circuits that may be utilized to implement row redundancy schemes and techniques for memory applications in accordance with various implementations described herein.
Figure 5B:
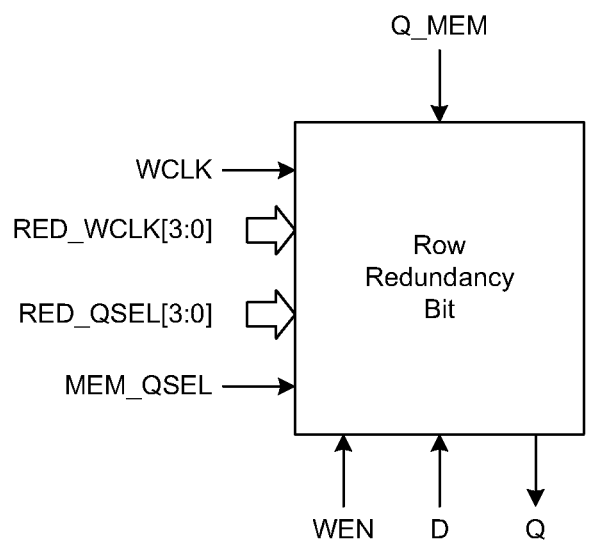
Figure 5C:
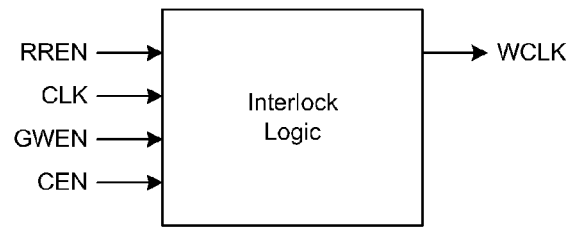
Figure 5D:
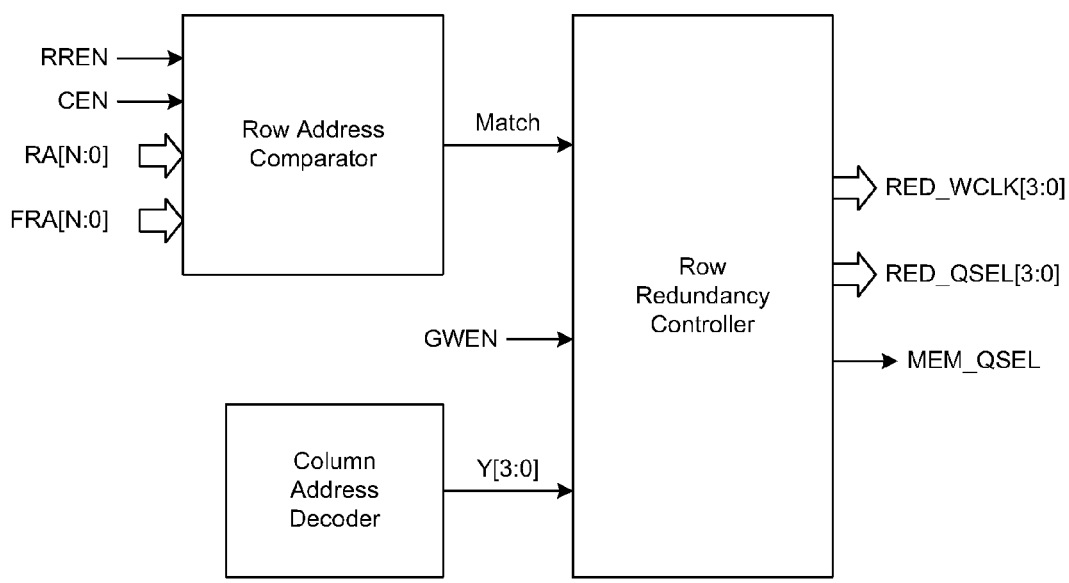
Figure 5E:
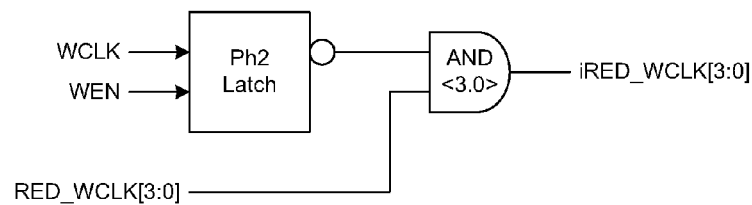
Figures 1, 5F:
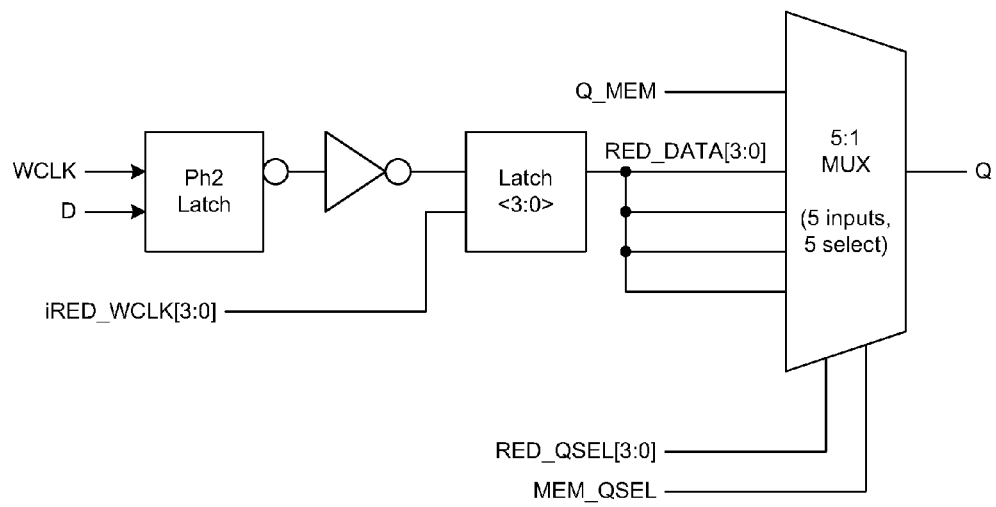

In particular, FIG. 5A illustrates a top level block diagram of a row redundancy controller or control block 500A, and FIG. 5B illustrates a top level block diagram of a Per Bit RR (Per Bit Row Redundancy) block 500B. FIG. 5C illustrates a top level block diagram of an interlock logic block 500C, and FIG. 5D illustrates a top level block diagram of a redundancy controller or control block 500D, including a row address comparator, a column address decoder, and an interlock and driver block. FIG. 5E illustrates a top level block diagram of a latch circuit 500E, and FIG. 5F-1 illustrates a top level block diagram of a per bit redundancy block 500E-1.

In some implementations, operation of the logic circuits in FIGS. 5A to 5F-1 will now be described. If the RREN input pin is not asserted (low), then a memory instance with row redundancy may operate in a same manner as a memory instance without row redundancy, except that the MEM_QSEL signal may be generated, which makes sure that the memory output (Q_MEM) is transferred to the output pin Q. Further, if the RREN input pin is asserted (high), then the regular memory instance is faulty (or defective): the repaired row is referenced.

In a write operation, with the RREN input pin asserted (high), data is written to regular memory array (e.g., SRAM). In this instance, WCLK is generated in the row redundancy controller 500A, and WCLK is provided to each per bit redundant block (Per Bit RR) and latches the bit write mask enable (WEN) and data input WEN. In parallel, comparison of asserted row address occurs with the faulty address (FA). If there is a match, depending on the selected column, one of the RED_WCLK [3:0] will go high, and based on the status of latched WEN, data RED_DATA[3:0] will be updated in the redundant latches. If there is no match, then no RED_WCLK[3:0] will be generated.

In a read operation, with the RREN input pin asserted (high), data is read from the regular memory array (e.g., SRAM) in a same way as a regular operation. In parallel, comparison of the asserted row address occurs with the faulty address (FA). If there is a match, depending on the selected column, one of RED_QSEL[3:0] is selected, and the corresponding RED_DATA from the latch is transferred to the output. If there is no match, then none of RED_QSEL [3:0] is selected, but the MEM_QSEL is selected, which in-turn transfers the memory output (Q_MEM) to the output pin Q.

Figures 2, 5F:
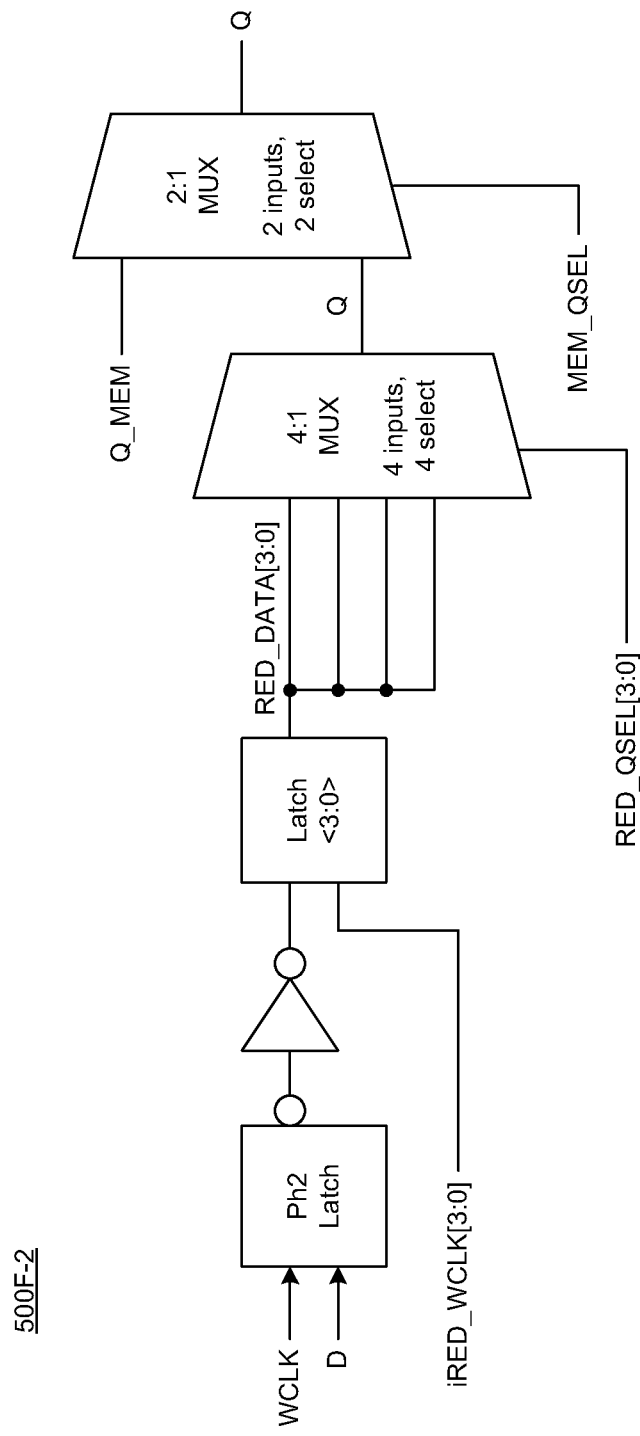
Figure 5G:
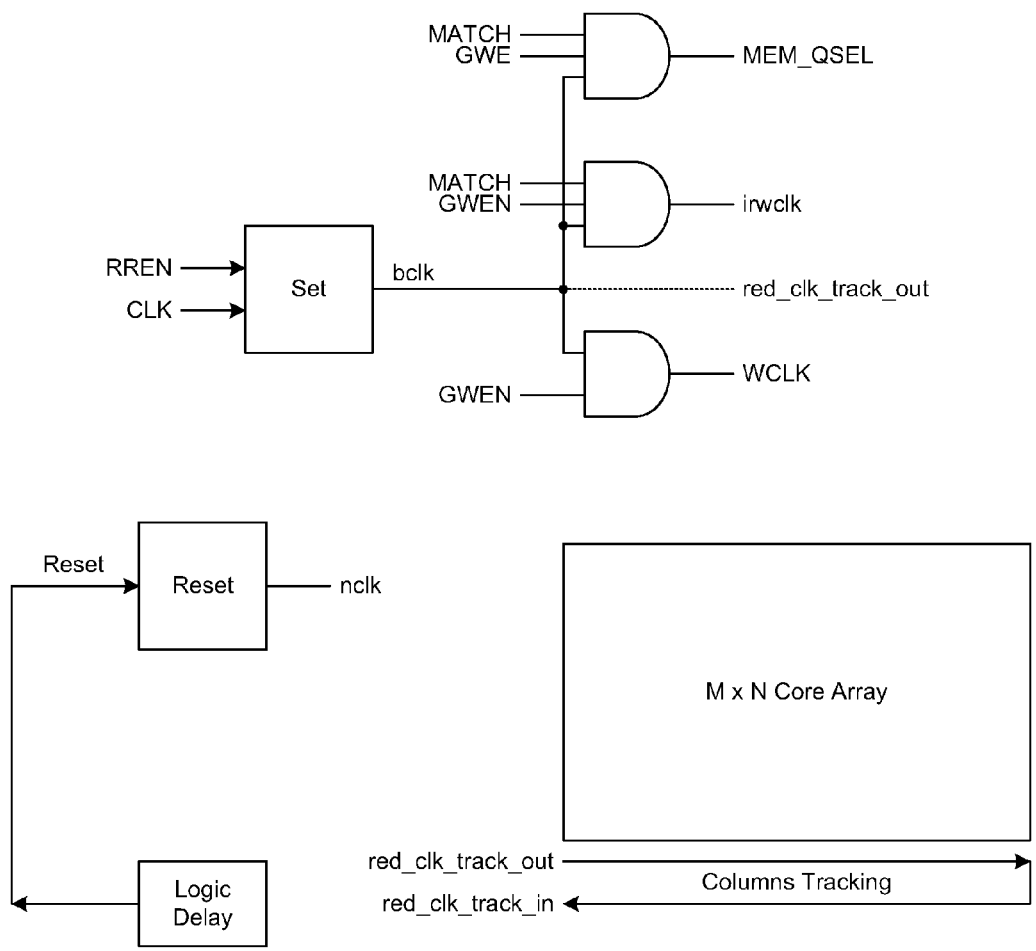
Figure 5H:
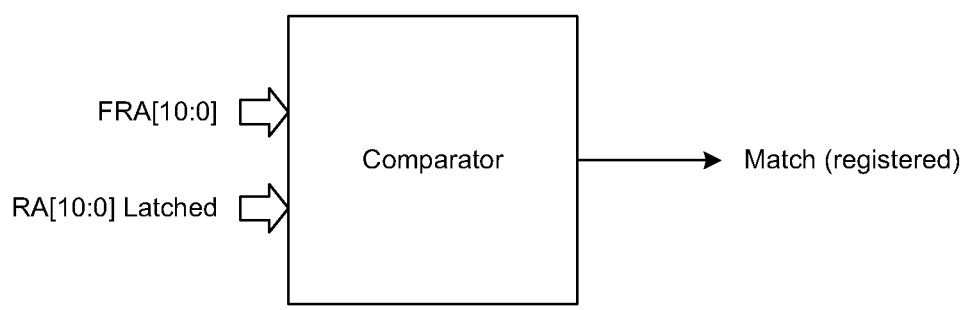
Figure 5H:
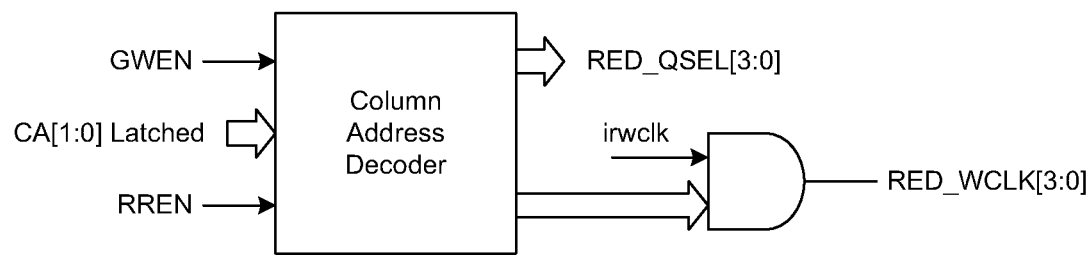

FIG. 5F-2 illustrates a top level block diagram of another per bit redundancy block 500E-2. FIG. 5G illustrates a top level block diagram of a clock (CLK) generation and tracing circuit 500G, and FIG. 5H illustrates a top level block diagram of a comparison and column decoding circuit 500H. In some cases, the MATCH and column address information may be included for input control.

In some implementations, in reference to FIGS. 5F-2 to 5H, clocking strategy and related timing diagram for WCLK, RED_WCLK [3:0] may be described. For instance, WCLK may be a fast clock that is generated for a write operation when Row Redundancy is enabled. Further, when the external clock CLK rises, RED_WCLK is generated, and when a row address matches a faulty address, a match signal that is used to generate the RED_WCLK may include horizontal tracking and some logic delay. In this instance, a falling edge of RED_WCLK may reset the WCLK low.

As shown herein below, Table 1 provides pin descriptions for the various logic circuits provided in reference to FIGS. 5A-5H.

TABLE 1

| Pin Name | Direction | Description |
| --- | --- | --- |
| CA[1:0] | Input (Controller) | 2-bit Column Address |
| RA[n:0] | Input (Controller) | n bit regular Row Address |
| FRA[n:0] | Input (Controller) | Static Repaired row address information (Faulty Row Address) |
| RREN | Input (Controller) | Redundant Row ENable (Active high) |
| CLK | Input (Controller) | External Clock |
| GWEN | Input (Controller) | 0 write to addressed memory location, 1 read addressed memory location (Global Write ENable) |
| CEN | Input (Controller) | Active low, Chip ENable |

TABLE 1-continued

| Pin Name | Direction | Description |
| --- | --- | --- |
| D | Input (Bit) | One bit of Data Input |
| WEN | Input (Bit) | Active low, bit Write ENable mask |
| Q_MEM | Input (Bit) | Q output coming from SRAM bit array |
| WCLK | Output (Controller) Input (Bit) | Fast WCLK to latch D and WEN signal |
| RED_WCLK[3:0] | Output (Controller) Input (Bit) | WCLKs for 4 redundant latches. Only when repaired and regular row address matches, for the selected column one of 4 RED_WCLKs will be generated. |
| MEM_QSEL | Output (Controller) Input (Bit) | If it is a read cycle and there is mismatch of regular and repaired row address then MEM_QSEL goes high and transmits data from memory to output |
| RED_QSEL[3:0] | Output (Controller) Input (Bit) | If it is a read cycle, regular and repaired row addresses matches, then for selected column one of 4 RED_QSEL will go high and transmit corresponding data to output |
| Q | Output (Bit) | Output of memory vs redundant latches mux |

As shown herein below, Table 2 provides truth table for row redundancy for the various logic circuits provided in reference to FIGS. 5A-5H.

TABLE 2

| RRE | Function |
| --- | --- |
| 0 | Row Redundancy Disabled |
| 1 | Row Redundancy Enabled |

In reference to FIGS. 5A-5H and Tables 1-2 provided herein and described above, various characteristics and operational parameters may apply. For instance, flop based row redundancy may impact retain time, wherein retain time may be similar to what is currently being observed for multi-bank instances. In operation, various latches may be used per bit, such as, e.g., 2 masters (1 for D and 1 for WEN) and 4 slave latches for MUX 4, 2 masters and 8 slave latches for MUX 8, and 2 masters and 16 slave latches for MUX 16. In case of write through and writing on a redundant row, writing to a faulty row may also be done, and Q for write through may be provided from a latch. During scan mode, redundant latches may be disabled, and a redundant row may be tested by BIST (built-in self test, for pre and post-repair).

During a read operation, column decoding may transfer selected column data from slave latches before comparison of row address occurs. Further, during a read operation, based on column decoding, data from slave latches may be transferred to an output. If row address comparison provides a match, then this output may be transferred to a final Q driver.

In memory cell arrays, different columns may be coupled through a column MUX (colmux) to a read/write circuit. In some cases, the column MUX may enable sharing of read/write circuitry and hence may improve array efficiency. For instance, a number of memory cells (or elements) in a row may be independent of MUX size and may depend on the number columns. If an SRAM row is replaced with a row of flip-flops, then in some cases, the number of flip-flops (master and slave latches) may be the same as the number of memory cells in the row. However, in accordance with various implementations described herein, one master latch per bit (MUX) and the same number of slave latches as the memory cells in the row may be used. In this instance, the master latch may be used to initially latch the data, and the slave latches may be used as memory cells. Further, irrespective of comparator outcome, data may be fast latched in the master latch. Later, if there is a match from the comparator, then depending on the column address, data from the master latch may be written in one of the slave latch.

As shown herein below, Table 3 provides a reference table for master/slave arrangements in row redundancy applications.

TABLE 3

|  | Regular Flip Flop | Present Implementation | Area Savings |
|---|---|---|---|
| Mux = 4 | 4 master, 4 slave latches | 1 master, 4 slave latches | 3 latches per bit |
| Mux = 8 | 8 master, 8 slave latches | 1 master, 8 slave latches | 7 latches per bit |
| Mux = 16 | 16 master, 16 slave latches | 1 master, 16 slave latches | 15 latches per bit |
| Mux = 32 | 32 master, 32 slave latches | 1 master, 32 slave latches | 31 latches per bit |

In accordance with various implementation described herein, there may be zero timing penalty as read/write operations may be faster from flip-flops. In some cases, even if an address is matched, parallel writing may be achieved in regular memory and in flip-flops. In some other cases, if an address is not matched, then data may be written only to regular memory. Further, writing circuitry for flip-flops may use two clocks. In this case, a first clock to a master latch is fast and latches the data without increasing setup time for data. Further, in some cases, a second clock to a slave latch is slow and is generated after/if a comparator provides a match signal. For flip-flops, there may be a single master latch per MUX, and the number of slave latches depends on the MUX size, as provided above in Table 3, e.g., for mux4 there are 4 slave latches, while for mux16 there may be 16 slave latches. These implementations increase area efficiency.

If reference to a number of clocks that may be used for write operation, there may be two clocks, such as, e.g., clock to master latches may provide a fast clock, while clock to slave latches may be slower, if incoming row address matches the faulty address. Clock to slaves may have information on column decoding, and a relationship between the clocks may be maintained at the control block.

In some cases, the D-ph2-latch may not be used as a master latch, and instead, the D-ph2 latch is in the colmux and may latch the data only in selected bank pair. For fb8, 4 extra tracks, per mux, maybe needed to bring latched data from each colmux, and then additional logic and bank select information may be needed to select 1 out of 4 Ds from different banks. In some cases, checking for setup of data at slave latch may be needed, and if the D-ph2 latch is used from bottom block, then modification of control may be needed for that block.

Controlling race between WCLK in colmux and slow clock may be difficult, and thus, having local D and WEN ph2 latch per mux may simplify some of the above problems. In some cases, the slow clock may be simplified, so that only 1 slow clock is sent and the previous data re-circulated. For instance, if a single slow clock is sent, then information on which column to write new data needs to be sent. Putting a MUX on the data may increase per bit area, and a fast clock may still be needed to latch D and WEN.

In some cases, an extra margin race-check for WCLK and iRED_WCLK[3:0] may be needed. For instance, controlling a falling edge of iRED_WCLK[3:0] may be used for de-asserting WCLK. In some cases, the WCLK may be generated to ensure that there is no pulse width evaporation. In this instance, horizontal RC tracking and logic delay may be used. Since reading and writing is not from the bitcell array, we may not need to have matching GTP, like tracking. Pulse width variance (PWvar) and pulse width margin (PWmargin) may be used for global clocks and control signals. If needed, a local EMA decode may be used for WCLK. In some cases, the row addresses that may be used for comparison are latched, and the input pins that may be used in row redundancy are latched locally, with FRAs as an exception.

In reference to timing impact, regular address setup time (tas) and memory access time (tac) may be used. In some instances, comparison time may be less than tas+tac, so there should be no timing impact due to row redundancy.

In some cases, a dynamic comparator may be used for row redundancy. In this instance, the dynamic comparator may be fast and in less area, but comparison may start after the clock rises. Dynamic comparators have their own complexity. In other cases, a static comparator may be used for row redundancy. In this instance, the static comparator may start comparison as soon as an address is available at the pins, and this may provide additional time for comparing a regular row address with a faulty address.

In some cases, with use of a static comparator, a glitch in a match signal may not cause a functionality failure. For instance, global signals sent to bit redundancy logic may be clocked, so even with a glitch on a match signal, the glitch may not be propagated to the bit redundancy logic. As described herein, FIGS. 5G-5H provide a block diagram of a row redundancy controller.

In accordance with various implementations described herein, some benefits and advantages of utilizing the row redundancy schemes may include one or more of no address setup time penalty, no margin or physical impact on SRAM array, bolt-on and digital operation. Further benefits and advantages may include area improvement as compared to other row redundancy approaches, and row redundancy may be built-in by a compiler, wherein no work may be needed at SoC level.

Figure 6:
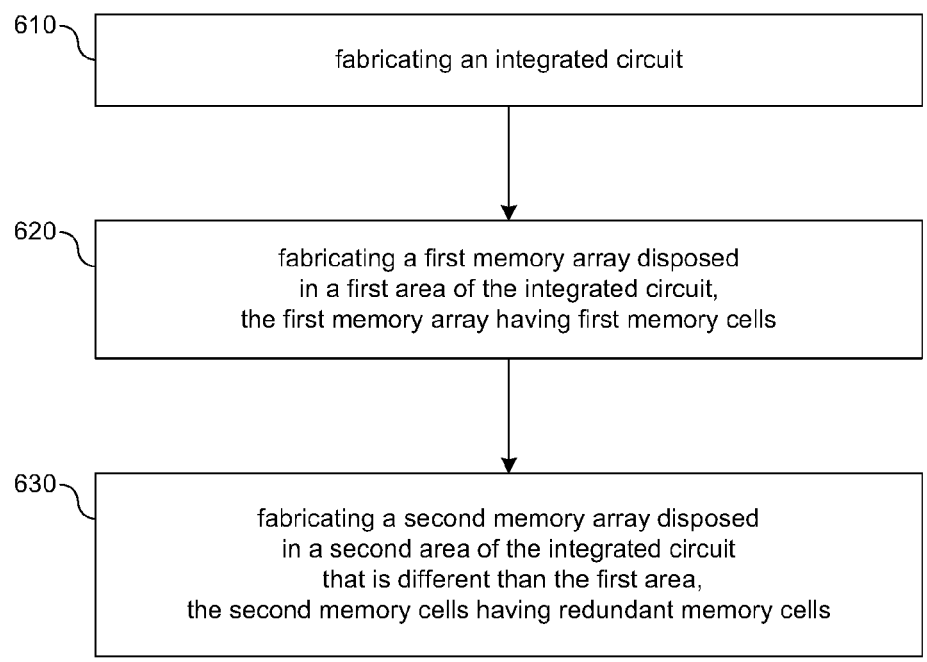
FIG. 6 illustrates a process flow of a method for providing row redundancy for memory in accordance with various implementations described herein.

FIG. 6 illustrates a process flow of a method 600 for providing row redundancy schemes for memory applications in accordance with various implementations described herein. It should be understood that even though method 600 may indicate a particular order of operation execution, in some instances, various certain portions of the operations may be executed in a different order, and on different systems. In some other instances, additional operations or steps may be added to and/or omitted from method 600. Further, the method 600 may be implemented in hardware and/or software. If implemented in hardware, the method 600 may be implemented with various circuit components, such as described herein above in reference to FIGS. 2A-5H. If implemented in software, the method 600 may be implemented as a program or software instruction process that may be configured to provide row redundancy as described herein. Further, if implemented in software, instructions related to implementing the method 600 may be stored in memory and/or a database. For instance, a computer or various other computing devices having a processor and memory may be configured to perform method 600.

In reference to FIG. 6, method 600 may provide row redundancy schemes for memory applications. In some implementations, at block 610, method 600 may fabricate an integrated circuit (IC). At block 620, method 600 may fabricate a first memory array disposed in a first area of the integrated circuit. The first memory array may include first memory cells. At block 630, method 600 may fabricate a second memory array disposed in a second area of the integrated circuit that is different than the first area. The second memory cells may include redundant memory cells.

In some implementations, the first memory array may be a first memory circuit having an array of the first memory cells arranged in first columns and first rows, and the second memory array may be a redundant memory circuit having an array of redundant memory cells arranged in second columns and second rows. Further, in some instances, the redundant memory circuit may be separate from the first memory circuit, the second columns may be aligned with the first columns, and/or the second rows may be separate from and in addition to the first rows.

In some implementations, if one or more of the first memory cells are defective, then each of the one or more defective first memory cells may be replaced with one of the redundant memory cells. Further, if one or more of the first memory cells are defective, then an address of each of the one or more defective first memory cells may be replaced with another address of one of the redundant memory cells.

In some implementations, the first memory circuit may include a first controller that controls access to each of the first memory cells. The first controller may include an address comparator that compares addresses of faulty (or defective) memory cells of the first memory cells to other addresses of the redundant memory cells. If a match exists, then an address of a defective memory cell may be replaced with another address of a redundant memory cell. Further, the redundant memory circuit may include a redundancy controller that controls access to each of the redundant memory cells based on access requests received from the first controller. Further, in some implementations, method 600 may fabricate output multiplexing circuitry that receives data signals from the first memory circuit and the redundant memory circuit and provides at least one of the received data signals as output based on one or more selection control signals received from the first controller and/or the redundancy controller.

Described herein are various implementations of an integrated circuit. The integrated circuit may include a first memory cell array disposed in a first area of the integrated circuit. The first memory cell array includes first memory cells. The integrated circuit may include a second memory cell array disposed in a second area of the integrated circuit that is different than the first area. The second memory cell array includes redundant memory cells that are separate from the first memory cells.

Described herein are various implementations of a device. The device may include a first memory circuit having an array of first memory cells arranged in first columns and first rows. The device may include a redundant memory circuit having an array of redundant memory cells arranged in second columns and second rows. The redundant memory circuit is separate from the first memory circuit. The second columns are aligned with the first columns. The second rows are separate from and in addition to the first rows.

Described herein are various implementations of a method of fabricating an integrated circuit. The method may include fabricating a first memory array disposed in a first area of the integrated circuit. The first memory array includes first memory cells. The method may include fabricating a second memory array disposed in a second area of the integrated circuit that is different than the first area. The second memory array includes redundant memory cells that are separate from the first memory cells.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    a first memory cell array disposed in a first area of the integrated circuit, the first memory cell array having first memory cells and a first controller that controls access to each of the first memory cells;
    a second memory cell array disposed in a second area of the integrated circuit that is different than the first area, the second memory cell array having redundant memory cells that are separate from the first memory cells; and
    output multiplexing circuitry that receives data signals from the first memory cell array and the redundant memory cell array, and provides at least one of the received data signals as output based on one or more selection control signals received from the first controller.

2. The integrated circuit of claim 1, wherein:
    the first memory cells are arranged in first columns and first rows,
    the second memory cells are arranged in second columns and second rows, and
    the second columns are aligned with the first columns, and the second rows are separate from and in addition to the first rows.

3. The integrated circuit of claim 1, wherein the second memory cell array comprises a redundant memory cell array having the redundant memory cells.

4. The integrated circuit of claim 1, wherein the second memory cell array comprises a row redundancy memory cell array having one or more rows of the redundant memory cells.

5. The integrated circuit of claim 1, wherein, if one or more of the first memory cells are defective, then each of the one or more defective first memory cells is replaced with one of the redundant memory cells.

6. The integrated circuit of claim 1, wherein, if one or more of the first memory cells are defective, then an address of each of the one or more defective first memory cells is replaced with another address of one of the redundant memory cells.

7. The integrated circuit of claim 1, wherein, if one or more of the first memory cells are defective, then one or more addresses of the defective first memory cells correspond to one or more other addresses of the redundant memory cells.

8. The integrated circuit of claim 1, wherein the first controller includes an address comparator that compares addresses of defective memory cells of the first memory cells to other addresses of the redundant memory cells, and if a match is determined to exist, then an address of a defective memory cell is reassigned to another address of a redundant memory cell.

9. The integrated circuit of claim 1, wherein the second memory cell array includes a redundancy controller that controls access to each of the redundant memory cells based on access requests received from the first controller.

10. The integrated circuit of claim 1, wherein the first memory cells of the first memory cell array are implemented with static random access memory (SRAM) circuitry.

11. The integrated circuit of claim 1, wherein the redundant memory cells of the second memory cell array are implemented with flip-flop logic circuitry.

12. A device, comprising:
    a first memory circuit having an array of first memory cells arranged in first columns and first rows; and
    a redundant memory circuit having an array of redundant memory cells arranged in second columns and second rows,
    wherein the redundant memory circuit is separate from the first memory circuit,
    wherein the second columns are aligned with the first columns,
    wherein the second rows are separate from and in addition to the first rows,
    wherein the first memory circuit includes a first controller that controls access to each of the first memory cells,
    wherein the first controller includes an address comparator that compares addresses of defective memory cells of the first memory cells to other addresses of the redundant memory cells, and
    wherein if a match exists, then an address of a defective memory cell is replaced with another address of a redundant memory cell.

13. The device of claim 12, wherein, if one or more of the first memory cells are defective, then each of the one or more defective first memory cells is replaced with one of the redundant memory cells.

14. The device of claim 12, wherein, if one or more of the first memory cells are defective, then an address of each of the one or more defective first memory cells is replaced with another address of one of the redundant memory cells.

15. The device of claim 12, wherein the redundant memory circuit includes a redundancy controller that controls access to each of the redundant memory cells based on access requests received from the first controller.

16. The device of claim 12, further comprising output multiplexing circuitry that receives data signals from the first and redundant memory circuits and provides at least one of the received data signals as output based on one or more selection control signals received from the first controller.

* * * * *